United States Patent [19]
Chung

[11] Patent Number: 6,063,702
[45] Date of Patent: May 16, 2000

[54] GLOBAL PLANARIZATION METHOD FOR INTER LEVEL DIELECTRIC LAYERS USING IDL BLOCKS

[75] Inventor: Henry Chung, Singapore, Singapore

[73] Assignee: Chartered Semiconductor Manufacturing, Ltd., Singapore, Singapore

[21] Appl. No.: 08/789,720

[22] Filed: Jan. 27, 1997

[51] Int. Cl.$^7$ .............................................. H01L 21/302
[52] U.S. Cl. ...................... 438/624; 438/427; 438/626; 438/634; 438/697
[58] Field of Search .................. 438/624, 626, 438/633, 639, 697, 699, 427; 198/DIG. 137

[56] References Cited

U.S. PATENT DOCUMENTS

| | | | |
|---|---|---|---|
| 3,976,524 | 8/1976 | Feng | 438/699 |
| 5,015,602 | 5/1991 | Van Der Plas et al. | 437/67 |
| 5,077,234 | 12/1991 | Scoopo et al. | 438/427 |
| 5,175,122 | 12/1992 | Wang et al. | 438/427 |
| 5,346,584 | 9/1994 | Nasr et al. | 438/427 |
| 5,350,486 | 9/1994 | Huang | 156/633 |
| 5,445,996 | 8/1995 | Kodera et al. | 438/633 |
| 5,494,857 | 2/1996 | Cooperman et al. | 438/427 |
| 5,518,950 | 5/1996 | Ibok et al. | 437/67 |
| 5,534,901 | 7/1996 | Drake | 347/63 |
| 5,635,428 | 6/1997 | Martin et al. | 438/624 |
| 5,792,707 | 8/1998 | Chung | 438/633 |

OTHER PUBLICATIONS

Wolf et al. "Silicon Processing for the VLSI ERa" vol. 1, pp. 421–423, 1996.

*Primary Examiner*—Carl Whitehead, Jr.
*Assistant Examiner*—Maria Guerrero
*Attorney, Agent, or Firm*—George O. Saile; Rosemary L. S. Pike; William J. Stoffel

[57] ABSTRACT

The present invention provides a method of manufacturing of planarizing an insulating layer using a reduced size reversed interconnect mask and an etch stop layer. Spaced interconnections 22 are provided over the semiconductor substrate 10. An etch stop layer 26 is formed over the raised portions 22. A dielectric layer 30 is formed over the etch stop layer 26. The top of the first dielectric layer 30 over the valley 23 is about coplanar with the top of the etch stop layer 26 over the raised portion 22. A reduced size, reverse interconnect (photoresist) mask 40 is formed over the first dielectric layer 30. The reduced size, reverse interconnect mask 40 covers portions of the valleys 23 between the raised portions. The first dielectric layer 30 is etched using the reverse interconnect mask 40 as an etch mask leaving dielectric blocks 30A over the narrow valleys 23. The dielectric blocks 30A fill in the valleys 23 between the raised portions thereby eliminating the need for a global planarization step. A second dielectric layer formed over the etch stop layer 26 and blocks 30A thereby providing the dielectric layer with a planar top surface.

13 Claims, 2 Drawing Sheets

GLOBAL PLANARIZATION METHOD FOR INTER LEVEL DIELECTRIC LAYERS USING IDL BLOCKS

BACKGROUND OF THE INVENTION

1) Field of the Invention

This invention relates generally to the planarization of integrated circuit dielectric structures and more particularly to an improved process for the global planarization of dielectric layers using an etch stop layer and a reversed reduce sized mask.

2) Description of the Prior Art

A major challenge in semiconductor manufacturing is the planarization of insulating layers formed over depressions and raised portions over a semiconductor structure (e.g., a wafer). The depression in the surface of the semiconductor structure can be a space located between conductor tracks (for example of aluminum or of polycrystalline ) disposed on a substrate, but may also be a groove etched into the substrate or it may be a window provided in an insulating layer. Local planarization is the filling of small spaces (gaps) between raised portions while global planarization is the filling of wider spaces (gaps).

A typical structure would be formed in the following manner. A conductive layer would be patterned over a semiconductor structure (or a trench formed in a wafer). The conductor is often covered with a protection layer, such as a low temperature oxide like a plasma enhanced oxide. An insulating layer would be formed over the irregular surface. The insulating layer would be planarized.

There are numerous known methods for planarizing wafer during fabrication of integrated circuits, for example, block resist and resist etch back, block resist and spin on glass. For example, the raised portions (hills of conductor or substrate) can be covered with an insulating layer such as a spin on glass. To planarized the hills and valleys, the spin-on glass is etched back to attempt to achieve a smooth surface on the integrated circuit. However, as the spin-on-glass is etched through in the region over the raised portions (e.g., exposed an underlying oxide layer), oxygen free radicals are released from the plasma enhanced oxide which enhances the etch rate of the spin-on-glass in the valley regions. The etch rate of the spin-on-glass can be 50% or higher than that of the plasma-enhanced oxide, depending on the etch chemistry. Thus, the planarization of the integrated circuit involves critical process parameters that are difficult to control, especially when an etch into the underlying plasma-enhance oxide is required.

Also chemical-mechanical polish (CMP) has been used in planarization. chemical-mechanical polishing (CMP) provides full wafer planarization without additional masking or coating steps. However, one of the difficulties encountered with CMP for hollow/valley/trench planarization is the "dishing" effect which occurs in wide low spots (e.g., valleys between interconnects or metal lines or trenches) (i.e., usually >25 $\mu$m). Dishing is the removal portions of insulating layer in "open areas" below the plane of the insulating layer over level or higher area. Dishing is particularly sever in hollows wider than 100 $\mu$m. The "dishing" effect during polishing results in thinning of the dielectric in wide trenches resulting in a nonplanar surface. The polish rate is affected by the topology of the surrounding areas.

Much effort has been directed to modify the planarization etch back and polish processes, equipment, and materials in an attempt to improve the planarization process. For example, U.S. Pat. No. 5,015,602 (Van Der Plas et al.) shows a method of planarizing an oxide layer covering trenches using a reverse trench mask. U.S. Pat. No. 5,350,486 (Huang) shows a method of planarizing a glass layer over metal lines. The patent uses a reverse metal mask to etch the glass layer. U.S. Pat. No. 5.518,950 (Ibok et al.) shows another negative resist pattern planarization. However, these methods can be further improved upon by providing a simpler, more manufacturable process which yields a more planar surface.

SUMMARY OF THE INVENTION

It is an object of the present invention to provide a method for planarizing a dielectric layer over raised portions which provide superior planarization.

It is an object of the present invention to provide a method for planarizing a dielectric layer over raised portions using two planarization layers and a reduced size, reverse interconnect pattern mask which provides superior planarization.

It is an object of the present invention to provide a method for planarizing a dielectric layer over wiring layers, field oxide regions and other raised surfaces using two planarization layers and a reduced size, reverse interconnect pattern mask which provides superior planarization.

It is yet another object of the present invention to provide a method for planarizing a dielectric layer over trenches and field oxide regions using two planarization layers and a reduced size, reverse interconnect pattern mask which provides superior planarization.

To accomplish the above objectives, the invention provides a method of forming a planar dielectric layer over a substrate having an irregular surface is provided. The method uses a first dielectric layer 30 that is patterned by a reduced size, reverse interconnect mask 40 to form dummy dielectric steps 30A. The dummy dielectric steps (blocks) 30A to fill in valleys 23 between interconnects 22 and other raised surfaces. A second dielectric layer 40 can be formed over the raised portions and the dummy steps 30A to produce a planar surface.

The method begins by forming spaced raised portions 22 separated by valleys 23 over a semiconductor substrate 10. An etch stop layer 26 is formed over the spaced raised portions 22. A first dielectric layer 30 is formed over the etch stop layer 26. A reduced size, reverse interconnect mask 40 is formed over the etch step stop layer 26. The reduced size, reverse (image) interconnect photoresist mask 40 covers portions of the valleys 23 between the spaced raised portions 22. The first dielectric layer 30 is etched using the reduced size, reverse interconnect mask 40 as an etch mask leaving dielectric layer blocks (dummy steps, blocks) 30A over the narrow valleys 23. A second dielectric layer 50 is formed over the etch stop layer and the dielectric blocks to form a planar surface.

The present inventions provides a cost effective global planarization method which uses dummy IDL steps 30A formed between raised portions (e.g., metal lines). The invention uses a local planarization technique (e.g., the dummy steps, the second dielectric layer and an etch back) to achieve complete planarization across the wafer. Therefore, CMP and other global planarization techniques are not required. The invention's elimination of the chemical-mechanical polishing step eliminates the dishing problem associated the chemical mechanical polishing. The reduced size interconnect mask is effective in patterning the first dielectric layer and filling in the valley, thereby allowing the valleys to be planarized with a simple local planarization technique (i.e., the second dielectric layer, not CMP or other complex processes). The method is cost effective.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Figure 1:
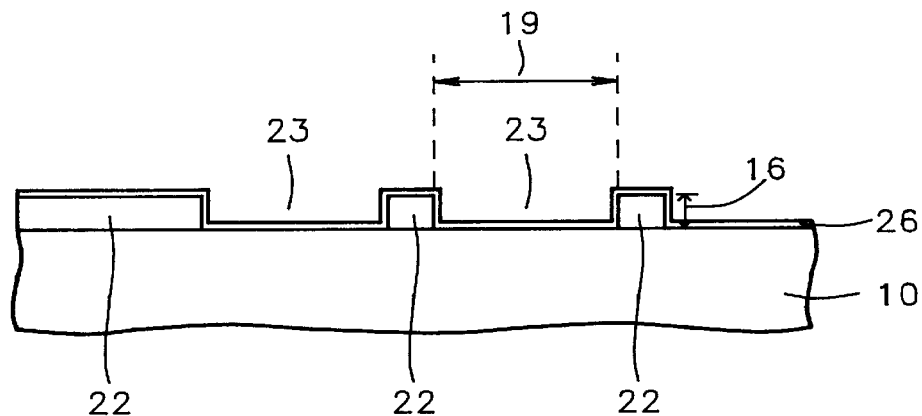
FIGS. 1 through 5 are cross sectional views for illustrating a method planarizing a dielectric layer using a reduced size, reverse (image) interconnect mask according to the present invention.

The present invention will be described in detail with reference to the accompanying drawings. The invention provides an improved method for forming highly planarized topologies in integrated circuit structures wherein oxide is used between active or conductive regions formed in or on an integrated circuit structure. In the illustrated embodiment, the process of the invention is shown, by way of illustration and not of limitation, as applied to in forming a highly planarized structure with a raised pattern 22 such as, by not limited to, metal line (interconnects) formed over an integrated circuit structure previously formed in and on a substrate, with oxide up and or between the raised pattern. The invention can also be applied to the forming of a highly planarized integrated circuit structure having field oxide deposited between active regions in a silicon substrate. For example, raised portions 22 in the figures can represent the substrate and/or field oxide and the low area (e.g., valley 23) can represent a trench in the substrate.

The invention provides a method of filling in valleys with dielectric material (e.g., dummy steps 30A) so that a local planarization technique can be successfully used to planarize the resulting surface. The invention uses a reduced size, reverse interconnect mask 40 and one etch stop layer 26. See FIG. 3. The method begins by providing semiconductor device structures in and on a semiconductor substrate 10. Substrate is understood to possibly include a semiconductor wafer, active and passive devices formed within the wafer and layers formed on the wafer surface. The term "substrate" is mean to include devices formed within a semiconductor wafer and the layers overlying the wafer.

As shown in FIG. 1, raised portions 22 (e.g., metal patterned to form metal lines or spaced interconnections with an insulating layer thereover) are provided over the semiconductor substrate 10. Between the raised portions are valleys 23 (e.g., valley topography between the raised portions or hollows). When the raised portions 22 comprises a conductor, it may comprise any conductor used in forming integrated circuit structures, such as, for example, aluminum, polysilicon or tungsten, capable of withstanding the temperature subsequently used in deposition the conformal and planarizing layers thereon. The raised pattern 22 might also comprise a combination of a raised pattern 22 of conductor and an insulating layer 22 formed over the conductor, or it might only comprise an insulating material or combinations thereof.

As shown in FIG. 1, the raised portions 22 preferably comprise conductors (e.g., interconnects). The conductors can be covered by an insulating layer (not shown). The spaced interconnections 22 preferably have a height 16 in a range of between about 3000 and 10,000 Å and a width in a range of between about 0.1 µm and 300 µm and a first spacing 19 between the interconnections 22 in a range of between about 0.1 and 300 µm.

Figure 2:
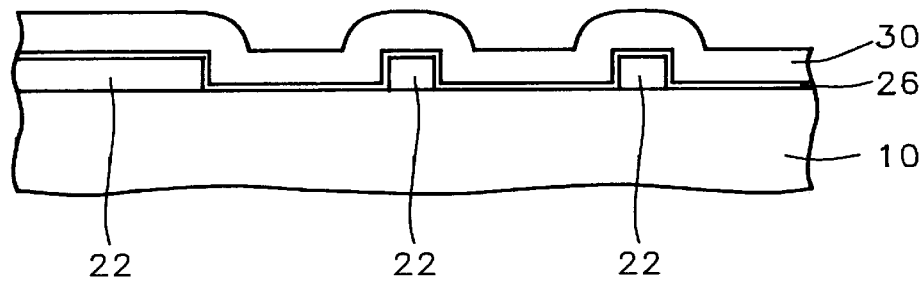

As shown in FIG. 2, an etch stop layer 26 is formed over the raised portion (e.g., insulating layer) 22. The etch stop layer 26 is preferably composed of silicon nitride or a material with a different etch rate than the dielectric layer 30. The etch stop layer 26 must have a significantly slower etch rate than the subsequently formed first dielectric layer 30 (e.g., from between about 2 to 20 times as slow). The etch stop layer 26 preferably has a thickness in a range of between about 100 and 4000 Å.

A dielectric layer 30 is formed over the etch stop layer 26. The thickness of the dielectric layer is at least sufficient to fill the valleys 23 level with the top of etch stop layer 26 over the raised portions 22. The first dielectric layer 30 is preferably composed of silicon oxide, TEOS, SOG (with or without an SOG etchback). The dielectric layer preferably has thickness in a range of between about 3000 and 12,000 Å.

The first dielectric layer 30, over the valley 23, has a height above the top plain of the etch stop layer (over the raised portions 22) within a range of between 0 and 1000 Å and more preferably between about 10 and 500 Å. The combined thicknesses of the etch stop layer 26 and the first dielectric layer 30 must be sufficient to fill the center of the valley 23 about coplanar (e.g., about +/−5%) with the top surface of the first polish layer 26 over the raised portions 22.

Figure 3:
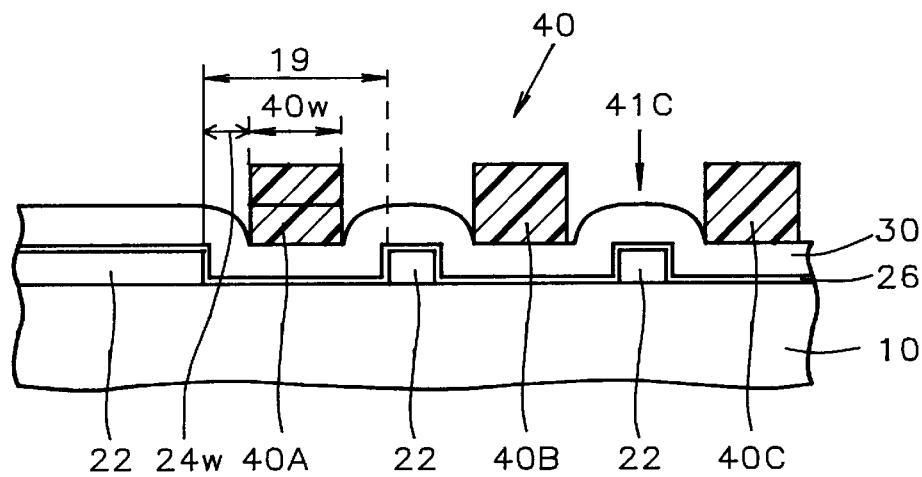

As shown in FIG. 3, a reduced size reverse interconnect photoresist mask 40 (reduced size, reverse raised portion photoresist mask 40) is formed over the first dielectric layer 30. The reverse interconnect mask 40 (40A 40B 40C) covers portions of the valleys 23 between the spaced interconnections (raised portions 22).

A photolithographic mask (e.g., optical mask), not shown which may be a reverse or negative mask of the masked used in the formation of the raised portions (interconnects 22 or other structure covered) is used to exposed regions 41A 41B 41C that overlie the raised portions 22. The reverse photolithographic mask has a metal pattern that is smaller (reduced size) than a full sized reverse mask. The reduced size, reverse raised portion mask 40 is preferably reduced in area (e.g., dimensions—length and width) compared to a fill sized reversed mask between about 0 and 5% and more preferably between 1 and 4%.

Alternatively, a negative photoresist layer may be used in place of the layer 40 and exposed through the optical mask used in the formation of the interconnects to form the patterned photo resist 40 as shown. The negative photoresist is over exposed to create the reduced size photoresist pattern 40 shown in FIG. 3. The photoresist can be overexposed between about 5 and 20%. Another option is that the size of the interconnect mask can be increased by the same percentages as above.

The reduced size reverse interconnect mask 40 (e.g., 40A, 40B, 40C) covers portions of the valleys 23 between the spaced raised portions 22. The sized reverse interconnect mask 40 is in registry with the valleys 23 between the interconnects. The sized reverse interconnect mask 40 (40A, 40B, 40C) has openings 41A 41B 41C in registry with the raised portions 22.

The sized reverse interconnect mask 40 has blocks 40A, 40B 49C that have a width in a range of between about the resolution of the lithography tools and as vide as desired.

FIG. 3 shows several measurements. The distance between adjacent raised portions (interconnects) 22 is distance 19. The combined thickness of the etch stop layer 26 and the first dielectric layer 30 and is length 24 W. This length 24 W is the amount that reversed interconnect mask blocks 40A, 40B, 40C, are reduced in size (or "sized") compared to a full sized reversed mask.

The reversed interconnect mask 40 (e.g., 40A) has a width 40W within +/−5% of the width 19 minus the two times the width 24 W (See FIG. 3).

$$W_{40W} = W_{19} - (2*(W_{24W}))$$

$W_{40W}$ must be equal to or greater than the lithographic resolution. If $W_{40W}$ is not, it should be set to zero, i.e., no mask is made for this region.

This measurement method is used for all raised portions including metal lines, field oxide regions, trenches, etc.

Figure 4:
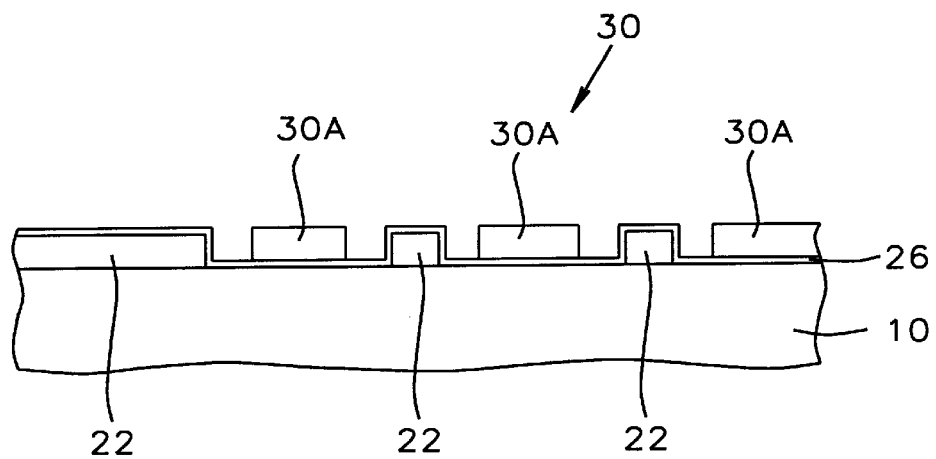

As shown in FIG. 4, the first dielectric layer 30 is etched using the reverse interconnect mask 40 as an etch mask leaving dielectric blocks 30A (i.e., dummy IDL blocks, dummy steps, etc.) over the valleys 23.

The first dielectric layer 30 is preferably removed preferably with a F-based plasma etch or a HF based wet etch. An option is that the horizontal exposed portion of the etch stop layer 26 can be selectively removed. The photoresist layer 40 can be removed by any etch including an $O_2$ asher process.

Figure 5:
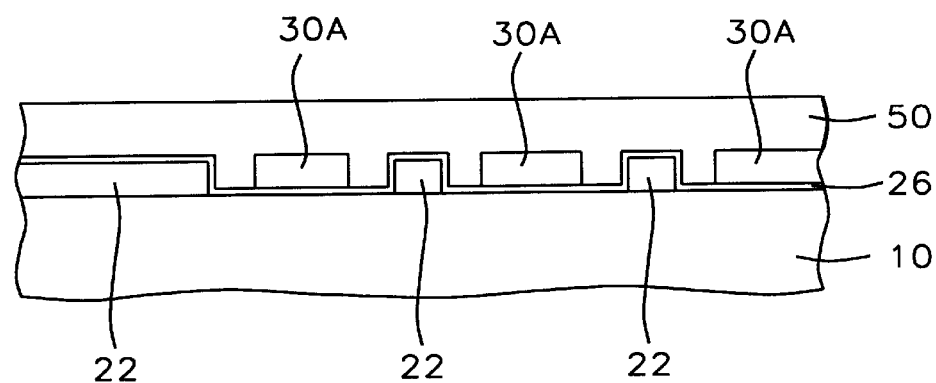

As shown in FIG. 5, a second dielectric layer 50 is formed over the etch stop layer 26 and the dielectric stop blocks 30A thereby forming level planar surface of the second dielectric layer 40. The second dielectric layer can comprise a material of silicon oxide, TEOS, spin-on-glass, HDP (high density plasma oxide), or a low dielectric constant material. The second dielectric layer preferably has a thickness in a range of between about 4000 and 20,000 Å.

In an optional process, the second dielectric layer 50 can be planarized future using a very brief chemical-mechanical polish (CMP).

It should be will understood by one skilled in the art that by including additional process steps not described in this embodiment, other types of devices can also be included over the substrate. It should also be understood that the figures depict only several raised portions (e.g., interconnects) out of a multitude of raised portions that are fabricated simultaneously on the substrate.

The present inventions provides a cost effective global planarization method which uses dummy IDL steps formed between metal line. The invention uses a local planarization technique (e.g., the dummy steps, 30A) an etch back and the second dielectric layer 50) to achieve complete planarization across the wafer. Therefore, CMP and other global planarization techniques are not required. The invention's elimination of the chemical-mechanical polishing step eliminates the dishing problem associated the chemical mechanical polishing. The reduced size interconnect mask is effective in patterning the first dielectric layer and filling in the valley allowing the valleys to be planarized with a simple local planarization technique. The method is cost effective.

While the invention has been particularly shown and described with reference to the preferred embodiments thereof, it will be understood by those skilled in the art that various changes in form and details may be made without departing from the spirit and scope of the invention.

What is claimed is:

1. A method of forming a planar dielectric layer over a substrate having an irregular surface having valleys and raised portions, comprising the steps of:

a) providing a semiconductor substrate having at least spaced raised portions and a valley therebetween;

b) forming an etch stop layer over said raised portions and said semiconductor substrate;

c) forming a first dielectric layer over said etch stop layer; the combined thicknesses of said etch stop layer, and said dielectric layer, being sufficient to fill the center of said valley coplanar within plus/minus 5% with the top surface of said etch stop layer over said raised portions; etch forming a reduced size, reverse raised portion mask over said first dielectric layer; said reduced size, reverse raised portion mask covering portions of said valleys between said raised portions; said reduced size, reverse raised portion mask is reduced in area compared to a full sized reversed raised portion mask between about 1 and 4%;

d) etching said first dielectric layer using said reduced size reverse raised portion mask as an etch mask forming dielectric stop blocks in said valleys; said etch stop layer must having between about 2 to 20 times slower etch rate than said first dielectric layer;

e) removing said reduced size, reverse raised portion mask; and f) forming a second dielectric layer over said etch stop layer and said dielectric stop blocks thereby forming a level planar surface of said second dielectric layer.

2. The method of claim 1 wherein said etch stop layer is composed of silicon nitride and said etch stop layer having a thickness in a range of between about 100 and 2000 Å.

3. The method of claim 1 wherein said first dielectric layer is composed of silicon oxide and said first dielectric layer having thickness in a range of between about 100 and 4000 Å.

4. The method of claim 1 wherein the top of said first dielectric layer, over said valley, is within a distance of between about 1 and 1000 Å of the top plane of said etch stop layer, over said raised portions.

5. The method of claim 1 wherein step (c) said reduced size, reverse raised portion mask is in registry with the valleys between said interconnects and said sized reverse raised portions mask having openings in registry with the raised portions exposing said first dielectric layer over said raised portions; and exposes an area of first dielectric layer around said raise portion a distance of the thickness of said first dielectric layer.

6. The method of claim 1 wherein said raised portions are interconnect layers covered by an insulating layer.

7. The method of claim 1 wherein said raised portions are segments of said substrate and said valley is a trench in said substrate.

8. The method of claim 1 wherein said second dielectric layer is composed of a material selected from the group consisting of: TEOS, spin-on-glass and high density plasma oxide and has a thickness in a range of between about 4000 and 20,000 Å.

9. A method of forming a planar dielectric layer over a substrate having an irregular surface having valleys and raised portions, comprising the steps of:

a) providing a semiconductor substrate having at least spaced raised portions and a valley therebetween, said spaced raised portions comprised of interconnects;

b) forming an etch stop layer composed of silicon nitride over said raised portionsand said semiconductor substrate; said etch stop layer has a thickness in a range of between about 100 and 2000 Å;

c) forming a first dielectric layer composed of silicon oxide over said etch stop layer, the top of said first dielectric layer over said valley being about coplanar with the top of said etch stop layer located over said raised portions;

the combined thicknesses of said etch stop layer and said first dielectric layer being sufficient to fill the center of said valley about coplanar with the surface of said etch stop layer over said raised portions; the top of said first dielectric layer over said valley, is within a distance of between about 1 and 1000 Å of the top plane of said etch stop layer, over said raised portions;

d) forming a reduced size, reverse raised portion mask over said first dielectric layer; said reduced size, reverse raised portion mask covering portions of said valleys between said raised portions, said reduced size reverse raised portion mask is in registry with the valleys between said interconnects and said sized reverse raised portions mask having openings is in registry with the raised portions and exposing said first dielectric layer over said raised portions; said reduced size, reverse raised portion mask is reduced in area compared to a fill sized reversed raised portion mask between about 0 and 5%;

e) etching said first dielectric layer using said reduced size reverse raised portion mask as an etch mask forming dielectric stop blocks in said valleys; said etch stop layer must having between about 2 to 20 times slower etch rate than said first dielectric layer;

f) removing said reduced size, reverse raised portion mask; and g) forming a second dielectric layer composed of silicon oxide over said etch stop layer and said dielectric stop blocks thereby forming level planar surface of said second dielectric layer.

10. The method of claim 9 wherein said raised portions have a height in a range of between about 3000 and 10,000 Å and a width in a range of between about 0.1 and 300 $\mu$m and a first spacing between said interconnections in a range of between about 0.1 and 300 $\mu$m.

11. The method of claim 9 wherein said first dielectric layer is composed of silicon oxide and said first dielectric layer having thickness in a range of between about 3000 and 12,000 Å.

12. The method of claim 9 which further includes after step (g) chemical-mechanical polishing said second dielectric layer.

13. A method of forming a planar dielectric layer over a substrate having an irregular surface having valleys and raised portions, comprising the steps of:

a) providing a semiconductor substrate having at least spaced raised portions and a valley therebetween, said spaced raised portions comprised of interconnects; said raised portions have a height in a range of between about 3000 and 10,000 Å and a width in a range of between about 0.1 and 300 $\mu$m and a first spacing between said interconnections in a range of between about 0.1 and 300 $\mu$m;

b) forming an etch stop layer composed of silicon nitride over said raised portions; said etch stop layer has a thickness in a range of between about 100 and 2000 Å;

c) forming a first dielectric layer composed of silicon oxide over said etch stop layer, the top of said first dielectric layer over said valley being about coplanar with the top of said etch stop layer located over said raised portions;

the combined thicknesses of said etch stop layer and said first dielectric layer being sufficient to fill the center of said valley about coplanar with the surface of said etch stop layer over said raised portions; the top of said first dielectric layer, over said valley, is within a distance of between about 1 and 1000 Å of the top plane of said etch stop layer, over said raised portions;

d) forming a reduced size reverse raised portion mask over said first dielectric layer; said sized reverse raised portion mask covering portions of said valleys between said raised portions, said reduced size reverse raised portion mask is in registry with the valleys between said interconnects and said sized reverse raised portions mask having openings is in registry with the raised portions and exposing said first dielectric layer over said raised portions; said reduced size, reverse raised portion mask is reduced in area compared to a full sized reversed raised portion mask between about 0 and 5%;

e) etching said first dielectric layer using said reduced size reverse raised portion mask as an etch mask forming dielectric stop blocks in said valleys; said etch stop layer must having between about 2 to 20 times slower etch rate than said first dielectric layer;

f) removing said reduced size, reverse raised portion mask; and g) forming a second dielectric layer composed of silicon oxide over said etch stop layer and said dielectric stop blocks thereby forming level planar surface of said second dielectric layer;

h) chemical-mechanical polishing said second dielectric layer.

* * * * *